(12) United States Patent
Pugh et al.

(10) Patent No.: US 7,375,379 B2
(45) Date of Patent: May 20, 2008

(54) LIGHT-EMITTING DEVICE

(75) Inventors: Mark Pugh, Los Gatos, CA (US);
Gerard Harbers, Sunnyvale, CA (US);
Robert Scott West, Morgan Hill, CA (US)

(73) Assignee: Philips Limileds Lighting Company, LLC, San Jose, CA (US)

( * ) Notice: Subject to any disclaimer, the term of this patent is extended or adjusted under 35 U.S.C. 154(b) by 123 days.

(21) Appl. No.: 11/313,120

(22) Filed: Dec. 19, 2005

(65) Prior Publication Data

US 2007/0138494 A1   Jun. 21, 2007

(51) Int. Cl.
*H01L 27/15* (2006.01)
*F21V 7/04* (2006.01)

(52) U.S. Cl. .............................. 257/79; 257/59; 257/98; 362/608

(58) Field of Classification Search ................. 257/79, 257/98, 59; 362/608
See application file for complete search history.

(56) References Cited

U.S. PATENT DOCUMENTS

| 6,995,400 | B2 * | 2/2006 | Mizuyoshi .................... 257/79 |
| 2003/0235050 | A1 * | 12/2003 | West et al. .................. 362/327 |
| 2004/0065886 | A1 * | 4/2004 | Eliashevich et al. .......... 257/79 |
| 2004/0233665 | A1 * | 11/2004 | West et al. .................. 362/245 |

* cited by examiner

*Primary Examiner*—Long K Tran
(74) *Attorney, Agent, or Firm*—Patent Law Group LLP; Brian D. Ogonowsky

(57) ABSTRACT

The invention provides a light-emitting device and a method of illumination. The light-emitting device includes one or more semiconductor layers, a reflective bottom surface, and a top surface coupled to semiconductor layer. The semiconductor layers include an active region where a primary light is generated. The relative position of the top surface, the reflective bottom surface and the active region is adjusted to substantially transmit the primary light through the sides of the light-emitting device.

17 Claims, 6 Drawing Sheets

LIGHT-EMITTING DEVICE

BACKGROUND

The invention relates generally to the field of illumination systems, and more specifically, to light-emitting devices with uniform side emission in the radial direction.

Light-emitting devices are widely used in backlighting of display devices such as laptops, Personal Digital Assistants (PDAs), mobile phones, and the like. These light-emitting devices may be used in isolation or may be coupled to an optical waveguide for uniform light transmission. An example of the light-emitting devices may include a Light-Emitting Diode (LED).

Existing light-emitting devices do not provide a spatially wide emission of light. The emission pattern causes creation of dark corners in the optical waveguide coupled to the existing light-emitting devices. Therefore, a uniform illumination may not be achieved using the existing light-emitting devices. Additional light-emitting devices are required to distribute the light uniformly over, for example, a display. This increases the cost of the illumination systems that include the existing light-emitting devices.

SUMMARY

An object of the invention is to provide a substantially thin light-emitting device.

Another object of the invention is to provide a light-emitting device that provides a uniform side emission of light in the radial direction, and may be efficiently coupled to an optical waveguide to produce uniform illumination.

Various embodiments of the invention provide a light-emitting device and a method of illumination. The light-emitting device includes one or more semiconductor layers, a reflective bottom surface and a top surface coupled to the semiconductor layers. The semiconductor layers include an active region where a primary light is generated. In accordance with an embodiment of the invention, the relative position of the top surface, the reflective bottom surface, and the active region may be adjusted to substantially transmit the primary light through the sides of the light-emitting device.

In accordance with various embodiments of the invention, the side emission pattern enables an efficient integration of the light-emitting device with an optical waveguide to produce a substantially thin illumination system. The illumination system produces a uniform illumination and may be used, for example, to illuminate a Liquid Crystal Display (LCD).

BRIEF DESCRIPTION OF THE DRAWINGS

Various embodiments of the invention will hereinafter be described in conjunction with the appended drawings, provided to illustrate and not to limit the invention, wherein like designations denote like elements, and in which.

DESCRIPTION OF VARIOUS EMBODIMENTS

Figure 1:
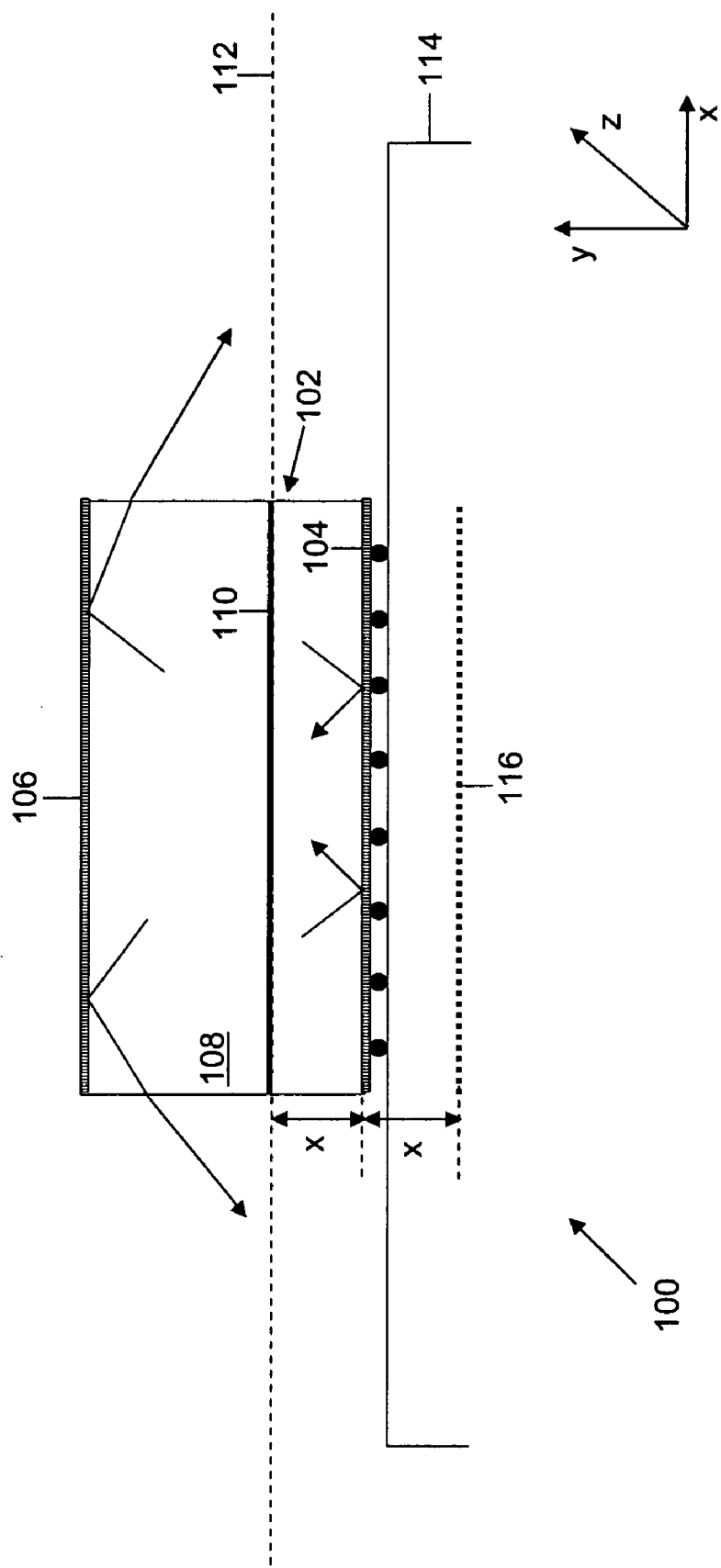
FIG. 1 is a cross-section of a light-emitting device, in accordance with an embodiment of the invention.

Various embodiments of the invention provide a light-emitting device and a method of illumination. The light-emitting device provides a uniform side emission in the radial direction. The light-emitting device may also be used in conjunction with an optical waveguide to produce a substantially thin illumination system that provides a uniform illumination FIG. 1 is a cross-section of a light-emitting device 100, in accordance with an embodiment of the invention. The cross-section is taken along a plane that is parallel to the x-y plane (as shown in FIG. 1). Light-emitting device 100 may be, for example, a Light-Emitting Diode (LED). Light-emitting device 100 includes one or more semiconductor layers 102, a reflective bottom surface 104, a top surface 106, and a substrate 108. Semiconductor layers 102 include one or more active regions such as an active region 110, with a central plane 112. Light-emitting device 100 is mounted on a submount 114. In accordance with various embodiments of the invention, reflective bottom surface 104, semiconductor layers 102 and top surface 106 form a stack. In accordance with an embodiment of the invention, light-emitting device 100 includes a flip-chip configuration to, for example, control conduction paths into and out of a junction in light-emitting device 100.

A primary light is generated in active region 110 by energizing semiconductor layers 102 by, for example, passing a current over the active region. The primary light may be, for example, a red light, a green light, a blue light, an Ultra Violet (UV) light, a near-UV light, and the like.

In accordance with an embodiment of the invention, top surface 106 reflects at least a portion of the primary light incident on top surface 106, in a direction substantially perpendicular to central plane 112. The portion of the primary light reflected by top surface 106 is hereinafter referred to as a first portion of the primary light, and the portion of the primary light transmitted by top surface 106 is hereinafter referred to as a second portion of the primary light. Reflective bottom surface 104 is also configured to reflect the primary light incident on reflective bottom surface 104, in the direction substantially perpendicular to central plane 112. Therefore, a cavity such as a Fabry-Perot cavity may be created between at least two of active region 110, reflective bottom surface 104 and top surface 106, depending upon the relative positions of active region 110, reflective bottom surface 104, and top surface 106. In accordance with an embodiment of the invention, the cavity is created between active region 110 and reflective bottom surface 104. The waves of the primary light from active region 110 and those from a mirror image 116 of active region 110 interfere with each other. Herein, mirror image 116 is the image of active region 110 in reflective bottom surface 104. In accordance with an embodiment of the invention, relative position of active region 110 and reflective bottom surface 104 may be adjusted to cause constructive or destructive interference of the primary light. Hence, the intensity of the primary light produced in light-emitting device 100 may be enhanced. Also, the relative position of reflective bottom surface 104, top surface 106, and active region 110 may be adjusted to vary the cavity effect and subsequently, the emission pattern of light-emitting device 100. For example, a predefined value of the distance x (as shown in FIG. 1) may substantially increase the emission of the primary light in one or more radial directions. Herein, the radial directions include the directions substantially parallel to central plane 112. In accordance with an embodiment of the invention, the predefined value of x may be of the order of the wavelength of the primary light and may depend upon the dimensions of light-emitting device 100.

In accordance with an embodiment of the invention, top surface 106 may completely cover the surface of substrate 108 (as shown in FIG. 1). In accordance with another embodiment of the invention, top surface 106 may cover a portion of the surface of substrate 108 (shown in FIG. 3). Further, top surface 106 may include a partial reflector or a total reflector. In accordance with various embodiments of the invention, top surface 106 and reflective bottom surface 104 may include a metal layer, a mirrored surface, and the like.

In accordance with an embodiment of the invention, substrate 108 may include a layer of a transparent material such as sapphire. Submount 114 may be made of a reflective material, or may have a coating or plating to reflect the primary light emitted in the radial directions. The coating may be a cold coating, for example, red colored, silver, Aluminum, enhanced Aluminum coating, or may be a highly reflective film. In particular, the coating may have a specular finishing. Further, if the submount is not very large, the coatings may be of a white diffuse material. In accordance with an embodiment of the invention, the white diffuse material may also be used as an underfill in the flip-chip configuration of light emitting device 100.

In accordance with an embodiment of the invention, light-emitting device 100 may have different geometries that may include but are not limited to a truncated inverted pyramid, a cube, a rectangular solid, a hemisphere, and the like. Further, light-emitting device 100 may include one or more intermediate layers (not shown in FIG. 1). Examples of the intermediate layers may include one or more single quantum wells or multiple quantum wells that may be used to improve the efficiency of light-emitting device 100.

In accordance with an embodiment of the invention, light-emitting device 100 may be used in, for example, direct backlighting of displays of televisions, mobile phones, Personal Digital Assistants (PDAs), and the like.

Figure 2:
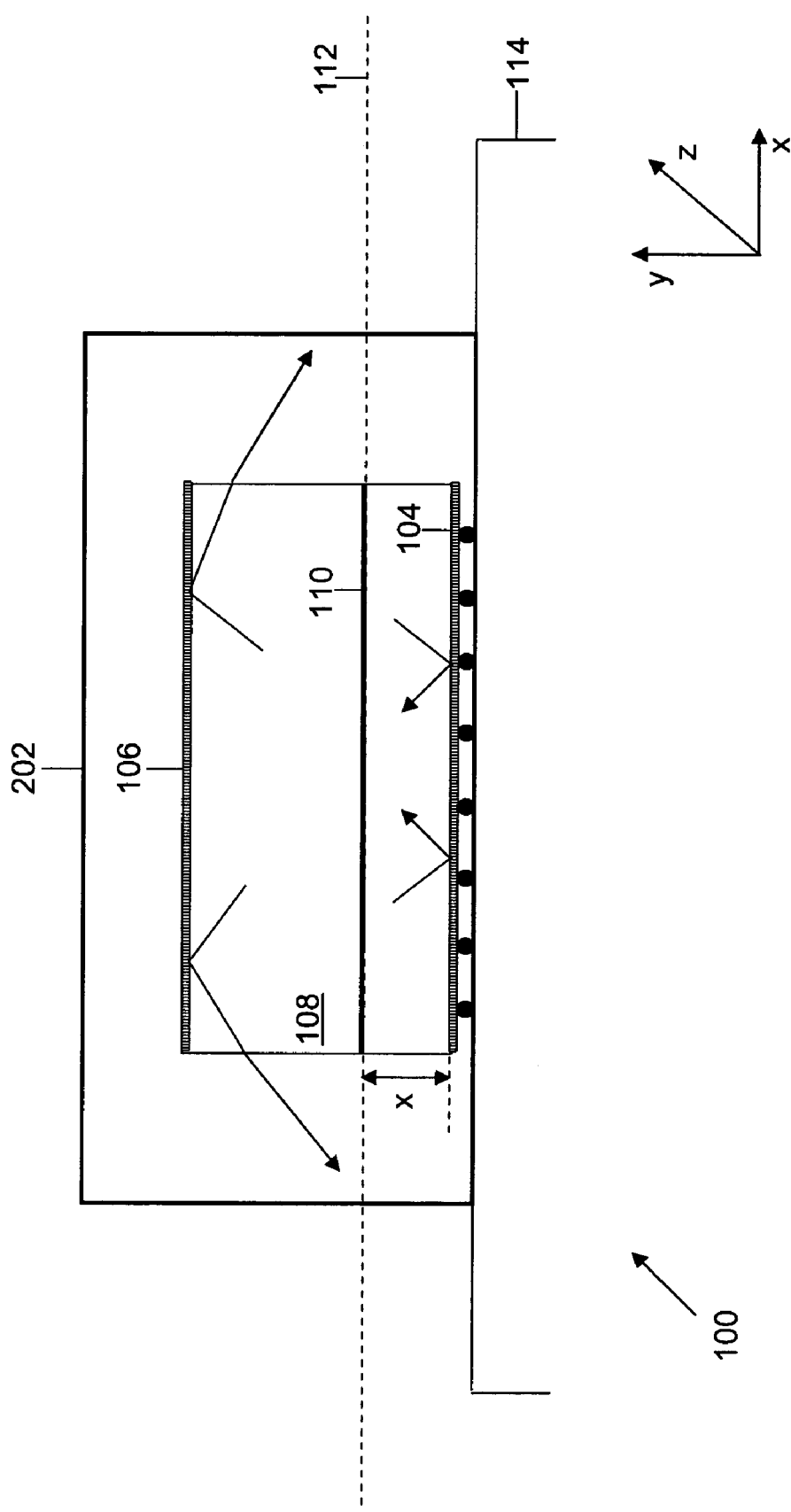
FIG. 2 is a cross-section of a light-emitting device, in accordance with FIG. 1.

FIG. 2 is a cross-section of light-emitting device 100, in accordance with FIG. 1. Herein, light-emitting device 100 further includes an overmold 202 to protect light-emitting device 100. Also, top surface 106 completely covers the surface of substrate 108 (as shown in FIG. 2), and substantially reflects the primary light incident on top surface 106.

In accordance with an embodiment of the invention, overmold 202 may be made of an optically transparent material such as a synthetic resin, glass, polycarbonate (PC), polymethylmethacrylate (PMMA), optically clear silicone, and the like. One or more surfaces of overmold 202 that are substantially perpendicular to the radial directions may also include sawteeth or other deformations to efficiently couple the primary light out of light-emitting device 100.

Figure 3:
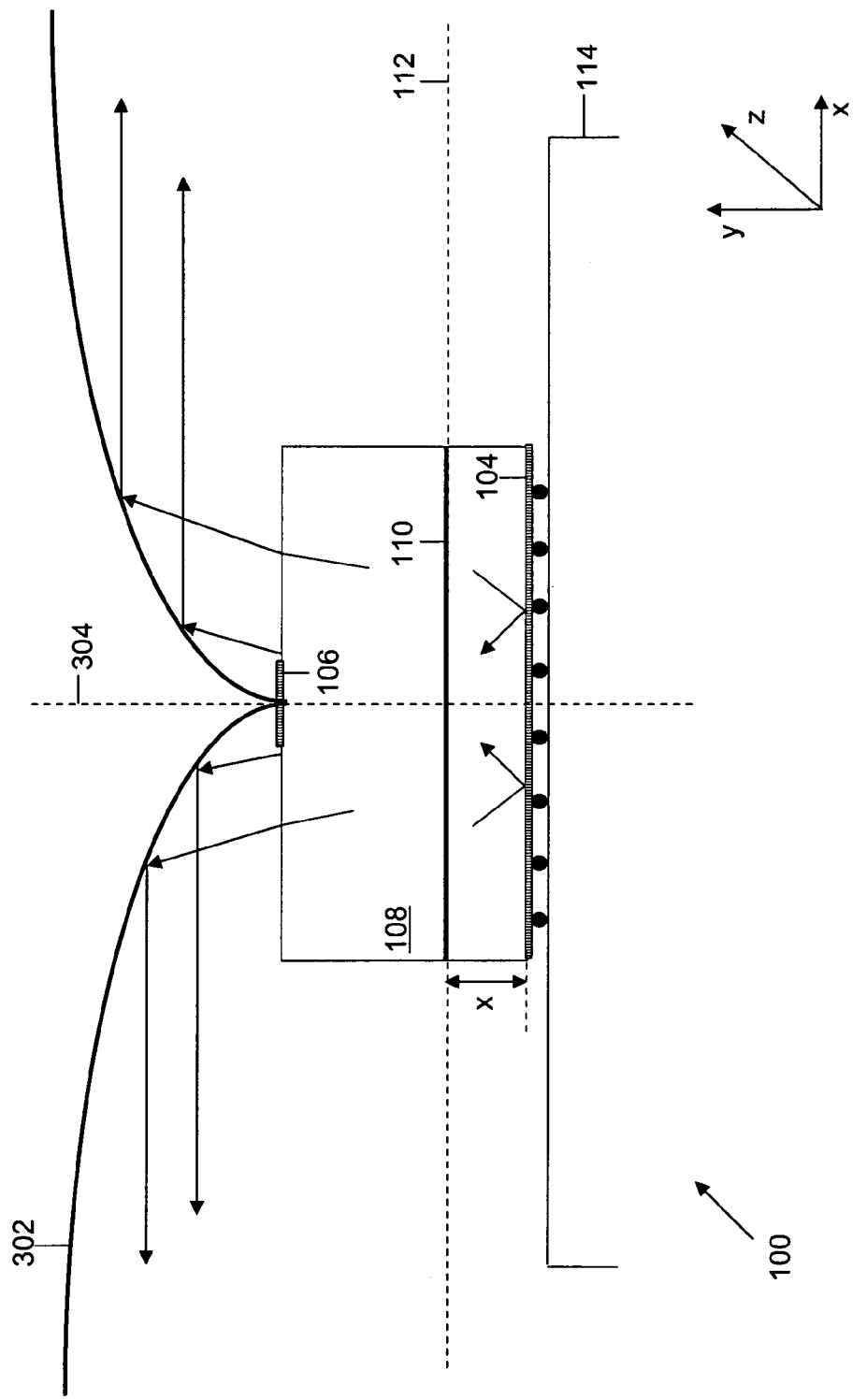
FIG. 3 is a cross-section of a light-emitting device, in accordance with FIG. 1.

FIG. 3 is a cross-section of light-emitting device 100, in accordance with FIG. 1. Herein, light-emitting device 100 further includes an optical concentrator 302 coupled to top surface 106. Top surface 106 covers a portion of the surface of substrate 108. In accordance with an embodiment of the invention, top surface 106 is a round or a square dot in the middle of the surface of substrate 108. In particular, top surface 106 redirects the primary light escaping around central axis 304.

Optical concentrator 302 may be used to redirect the second portion of the primary light in the radial directions and produce a collimated side emission. In accordance with an embodiment of the invention, the redirections may be performed using Total Internal Reflection (TIR).

In accordance with various embodiment of the invention, optical concentrator 302 may have different geometries. In particular, optical concentrator 302 may be symmetrical about a central axis 304 of light-emitting device 100. For example, optical concentrator 302 may include a parabolic or an elliptical concentrator that is symmetric about central axis 304. In accordance with an embodiment of the invention, optical concentrator may be implemented in conjunction with an overmold such as overmold 202. This will provide a collimated side emission in the radial direction and will also protect light-emitting device 100.

In accordance with various embodiments of the invention, optical concentrator 302 may include one or more layers of for example, Cyclic Olefin Copolymer (COC), PMMA, PC, PC/PMMA copolymer, silicones, fluorocarbon polymers, Polyetherimide (PEI), and the like.

Figure 4:
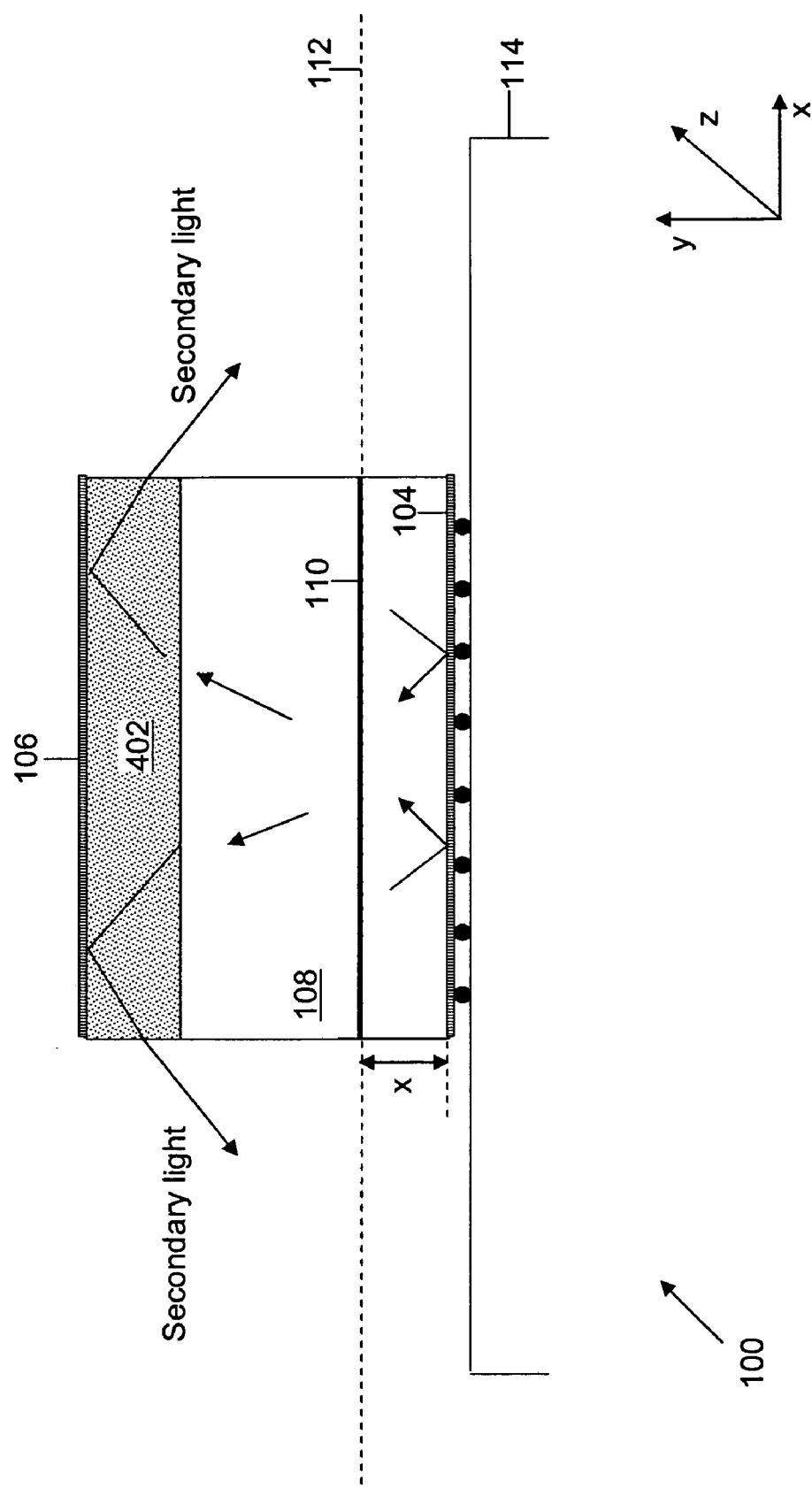
FIG. 4 is a cross-section of a light-emitting device, in accordance with an embodiment of the invention.

FIG. 4 is a cross-section of light-emitting device 100, in accordance with an embodiment of the invention. Light-emitting device 100 further includes a wavelength converter 402. Wavelength converter 402 converts at least a portion of the primary light to a secondary light. In accordance with an embodiment of the invention, wavelength converter 402 may be a phosphor layer. The secondary light may be, for example, a yellow light. Wavelength converter 402 may be placed in optical contact with substrate 108 (as shown in FIG. 4) or in direct contact with active region 110 (not shown in FIG. 4). For example, wavelength converter 402 may include a rigid phosphor plate, which may be bonded to substrate 108 by using a glass bond or silicone. In accordance with an embodiment of the invention, one or more layers of wavelength converter 402 may be deposited along the sides of light-emitting device 100 such that the layers are substantially perpendicular to the radial directions (not shown in FIG. 4). This will facilitate the conversion of the primary light to the secondary light.

In accordance with an embodiment of the invention, wavelength converter 402 may include a base material and a fluorescent material. The fluorescent material is interspersed in the base material, for example, in the form of particles. The fluorescent material converts the primary light, such as a blue light, to the secondary light, such as a yellow light. In accordance with an embodiment of the invention, the secondary light may be mixed with a portion of the primary light to create a substantially white light.

Examples of the base material may include optically clear silicone, acrylic, polycarbonate, and the like. The fluorescent material is selected according to the desired spatial spectral distribution of the secondary light. An example of the fluorescent material may include Yttrium Aluminum Garnet (YAG) grains. In accordance with various embodiments of the invention, wavelength converter 402 may be deposited using processes such as spin coating, electrophoresis, screen printing, overmolding, and the like. The concentration of the fluorescent material in wavelength converter 402 may be varied, according to, for example, the desired spatial spectral distribution of the secondary light or the substantially white light. In accordance with an embodiment of the invention, wavelength converter 402 includes only the fluorescent material.

In accordance with another embodiment of the invention, different fluorescent materials may be included in a single wavelength converter, such as wavelength converter 402.

Wavelength converter 402 may also include additives like rare earth metals to improve properties such as color-rendering of wavelength converter 402.

In accordance with various embodiments of the invention, wavelength converter 402 may be implemented along with overmold 202, for example, by depositing wavelength converter 402 over one or more surfaces of overmold 202. In particular, the inner surfaces of overmold 202 may include a layer of wavelength converter 402 (not shown in FIG. 4).

Figure 5:
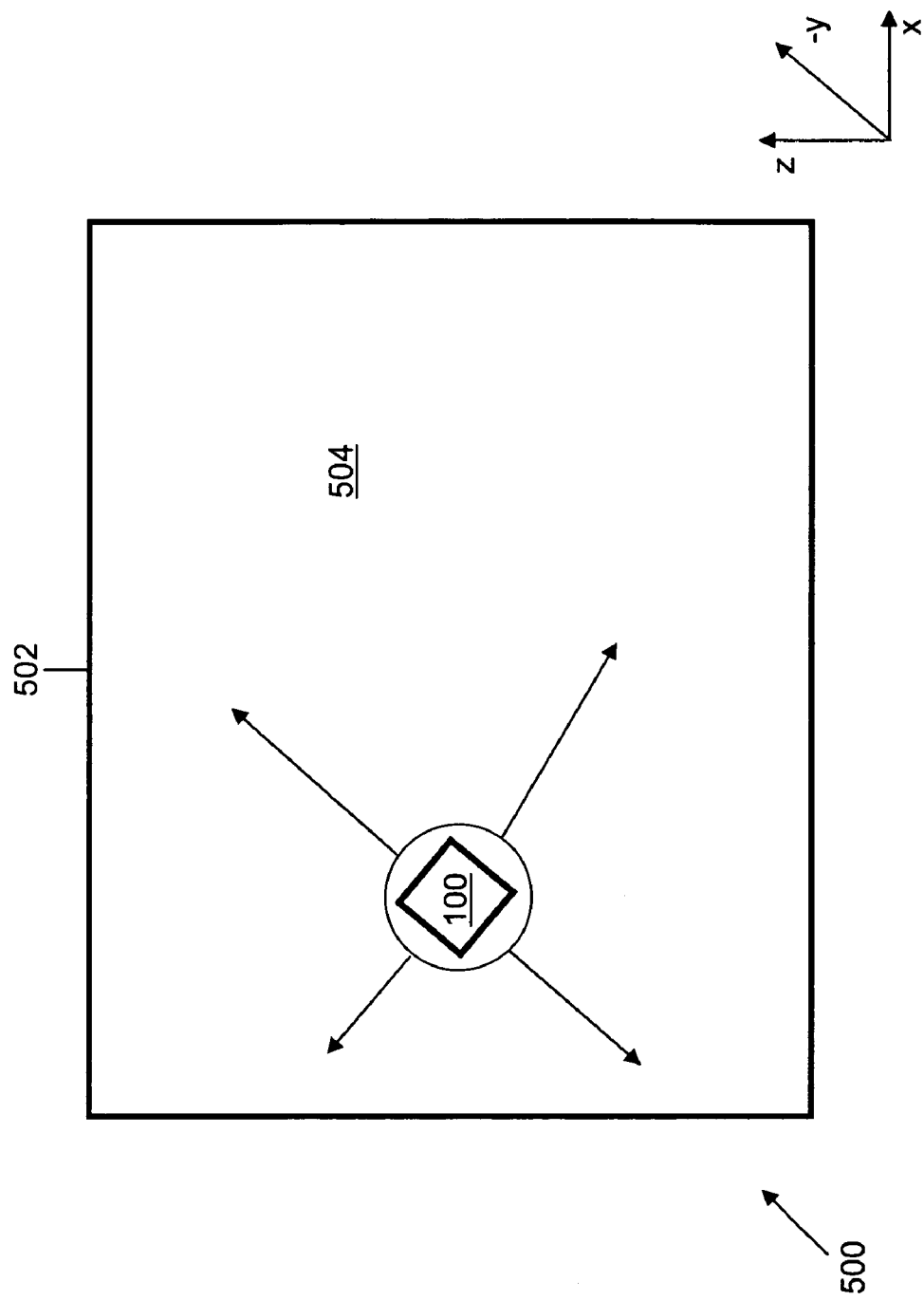
FIG. 5 is a cross-section of an illumination system, in accordance with an embodiment of the invention.

FIG. 5 is a cross-section of an illumination system 500, in accordance with an embodiment of the invention. The cross-section is taken along a plane that is parallel to the x-z plane (as shown in FIG. 5). Illumination system 500 includes one or more light-emitting devices such as light-emitting device 100, and a light-transmitting zone 502. Light-transmitting zone 502 is optically coupled to light-emitting device 100. In accordance with an embodiment of the invention, light-emitting device 100 may be placed inside one or more holes in light-transmitting zone 502 (as shown in FIG. 5).

Light-emitting device 100 produces a primary light, which is emitted into light-transmitting zone 502. Light-transmitting zone 502 transmits the primary light in the direction parallel to the y-axis. Light-transmitting zone 502 transmits the primary light such that the primary light may be used to uniformly illuminate a display. In accordance with an embodiment of the invention, the primary light produced by the light-emitting device 100 may be converted to a secondary light before being emitted into light-transmitting zone 502.

In accordance with an embodiment of the invention, light-transmitting zone 502 may include one or more transmitting surfaces such as a transmitting surface 504, and one or more non-transmitting surfaces. The primary light may be transmitted through the transmitting surfaces. Further, the transmitting surfaces and the non-transmitting surfaces together form a closed structure.

In accordance with an embodiment of the invention, light-transmitting zone 502 may be, for example, an optical waveguide, a hollow light guide, and the like. Light-transmitting zone 502 may be made of, for example, a synthetic resin, acryl, polycarbonate, PMMA, glass, and the like. In accordance with various embodiments of the invention, light-transmitting zone 502 may be of constant thickness or may be tapered along, for example, the x-axis or the z-axis. In particular, the cross-section x-y of light-transmitting zone 502 may have a wedge-shaped geometry or a rectangular geometry, and the like. In accordance with an embodiment of the invention, the thickness of illumination system 500, measured along the y-axis, may lie in the range of 0.4 mm to 10 mm.

In accordance with an embodiment of the invention, the primary light may undergo TIR in light-transmitting zone 502. The wedge-shaped geometry of light-transmitting zone 502 may facilitate frustration of TIR and subsequent transmission of the primary light through, for example, transmitting surface 504. The non-transmitting surfaces of light-transmitting zone 502 may be made reflective to facilitate transmission of the primary light through the transmitting surfaces and to assist a uniform distribution of the primary light in light-transmitting zone 502.

In accordance with an embodiment of the invention, at least one of the non-transmitting surfaces may include a plurality of coupling members. The coupling members may be provided to uniformly and efficiently couple the primary light out of light-transmitting zone 502 through, for example, transmitting surface 504. In accordance with various embodiments of the invention, the coupling members may include surface deformations like wedges and ridges, screen-printed dots, and the like. Herein, the coupling members may include different shapes and densities and may be provided by using processes such as printing, pressing, etching, scribing, sandblasting, and the like.

In accordance with an embodiment of the invention, the light-emitting devices such as light-emitting device 100 are placed in light-transmitting zone 502 such that the central axis of each light-emitting device is substantially parallel to the other. One or more intermediate layers may be present between light-emitting device 100 and light-transmitting zone 502. Examples of the intermediate layers may include a silicone layer, an epoxy layer, a coating that may enhance coupling of the primary light into light-transmitting zone 502, and the like.

In accordance with various embodiments of the invention, the holes may be of different shapes and sizes to, for example, efficiently couple the primary light from light-emitting device 100 into light-transmitting zone 502. Further, the number of the light-emitting devices placed in light-transmitting zone 502 may be determined according to the illumination required from illumination system 500.

In accordance with various embodiments of the invention, light-emitting device 100 as explained in conjunction with FIG. 1 through FIG. 4 may be used along with light-transmitting zone 502 in illumination system 500.

Figure 6:
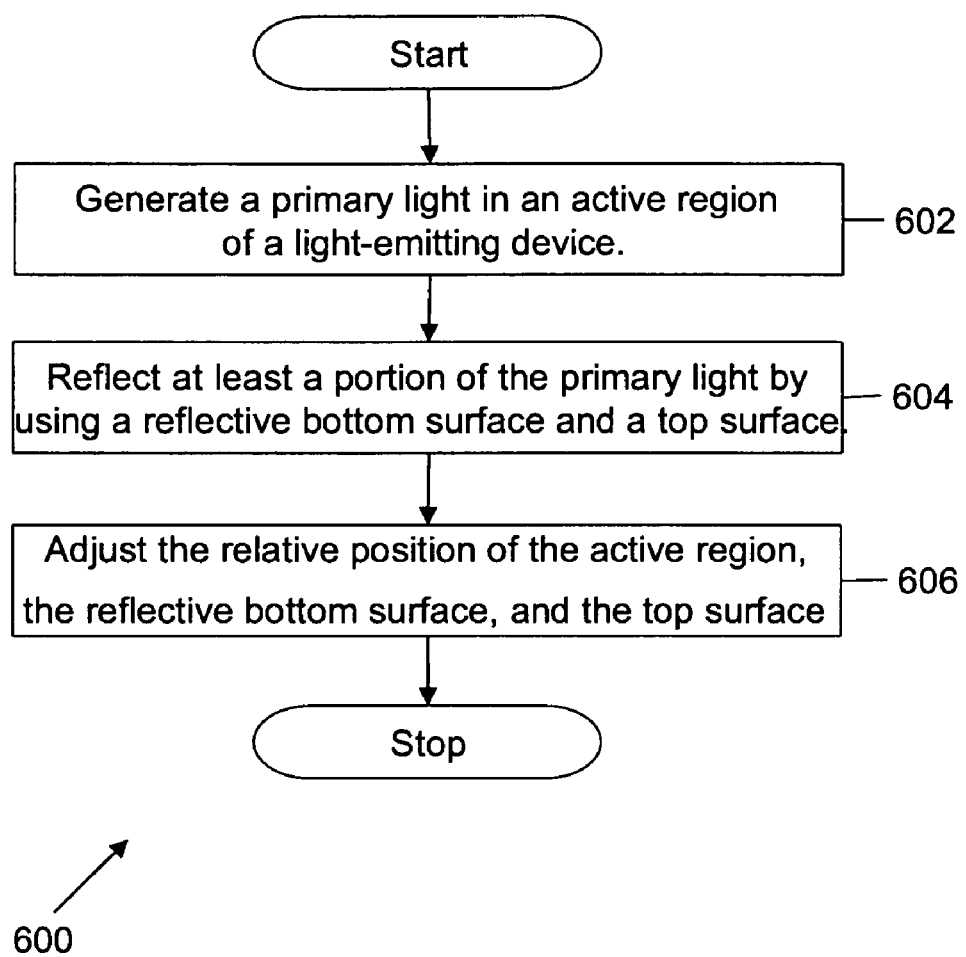
FIG. 6 is a flowchart of a method of illumination, in accordance with an embodiment of the invention.

FIG. 6 is a flowchart of a method 600 of illumination, in accordance with an embodiment of the invention. At step 602, a primary light is generated in active region of a light-emitting device such as light-emitting device 100. The generation of the primary light includes passing current through one or more semiconductor layers such as semiconductor layers 102. At step 604, at least a portion of the primary light is reflected by a top surface such as top surface 106, and a reflective bottom surface such as reflective bottom surface 104. Waves of the reflected primary light may interfere with each other or with the primary light from the active region to cause an increase or decrease the intensity of the primary light produced in the light-emitting device.

At step 606, relative position of the active region, the reflective bottom surface and the top surface is adjusted to increase the emission of the primary light in one or more radial directions. In particular, the distance between the active region and reflective bottom surface may be adjusted. Herein, the radial directions are the directions that are substantially parallel to the central plane of the active region. In accordance with an embodiment of the invention, method 600 further includes transmitting the primary light using, for example, a light-transmitting zone such as light-transmitting zone 502. Also, the primary light may be converted to a secondary light prior to transmission.

Various embodiments of the invention provide a light-emitting device with a uniform side emission in the radial direction. The emission pattern is symmetrical about the central axis of the light-emitting device. The light-emitting device illuminates an optical waveguide uniformly. This avoids the need of a separate diffuser layer. Further, this reduces the number of light-emitting devices required to illuminate the optical waveguide. Hence the cost and the thickness of the illumination system is reduced.

While various embodiments of the invention have been illustrated and described, it will be clear that the invention is not limited to these embodiments only. Numerous modifications, changes, variations, substitutions and equivalents will be apparent to those skilled in the art without departing from the spirit and scope of the invention, as described in the claims.

What is claimed is:

1. A light-emitting device comprising:
   a. at least one semiconductor layer, the at least one semiconductor layer comprising an active region, wherein a primary light is generated in the active region;
   b. a reflective bottom surface, the reflective bottom surface coupled to the at least one semiconductor layer; and
   c. a top surface, the top surface coupled to the at least one semiconductor layer, the top surface comprising a solid reflective layer, substantially parallel to the active region and substantially completely overlying the active region, the solid reflective layer reflecting a first portion of the primary light;
      wherein the top surface and the reflective bottom surface redirect the primary light in one or more radial directions, the solid reflective layer substantially preventing any light from being emitted through the solid reflective layer, the one or more radial directions including directions being substantially parallel to the central plane of the active region.

2. The light-emitting device of claim 1, wherein the reflective bottom surface, the at least one semiconductor layer and the top surface form a stack.

3. The light-emitting device of claim 1, wherein the relative position of the active region, the reflective bottom surface and the top surface is adjusted to substantially transmit the primary light in the one or more radial directions.

4. The light-emitting device of claim 1 further comprising an optically transparent overmold to protect the at least one semiconductor layer and the top surface.

5. A light-emitting device comprising:
   a. at least one semiconductor layer, the at least one semiconductor layer comprising an active region, wherein a primary light is generated in the active region;
   b. a reflective bottom surface, the reflective bottom surface coupled to the at least one semiconductor layer;
   c. a top surface, the top surface coupled to the at least one semiconductor layer, the top surface comprising a solid reflective layer, substantially parallel to the active region, the reflective layer reflecting a first portion of the primary light;
      wherein the top surface and the reflective bottom surface redirect the primary light in one or more radial directions, the solid reflective layer substantially preventing any light from being emitted through the solid reflective layer, the one or more radial directions including directions being substantially parallel to the central plane of the active region; and
   d. an optical concentrator, the optical concentrator coupled to the top surface, the top surface transmitting a second portion of the primary light, the optical concentrator redirecting the second portion of the primary light substantially parallel to the central plane of the active region, the solid reflective layer being only located at a central area overlying the active region to block light being emitted through a central area of the optical concentrator.

6. The light-emitting device of claim 5, wherein the optical concentrator is symmetrical about the central axis of the light-emitting device.

7. The light-emitting device of claim 5, wherein at least one surface of the optical concentrator comprises a reflective surface.

8. A light-emitting device comprising:
   a. at least one semiconductor layer, the at least one semiconductor layer comprising an active region, wherein a primary light is generated in the active region;
   b. a reflective bottom surface, the reflective bottom surface coupled to the at least one semiconductor layer;
   c. a top surface, the top surface coupled to the at least one semiconductor layer, the top surface comprising a solid reflective layer, substantially parallel to the active region and substantially completely overlying the active region, the solid reflective layer reflecting a first portion of the primary light;
      wherein the top surface and the reflective bottom surface redirect the primary light in one or more radial directions, the solid reflective layer substantially preventing any light from being emitted through the solid reflective layer, the one or more radial directions including directions being substantially parallel to the central plane of the active region; and
   d. a wavelength converter, the wavelength converter optically coupled to the at least one semiconductor layer, the wavelength converter converting the primary light to a secondary light.

9. The light-emitting device of claim 8, wherein the wavelength converter comprises a phosphor layer.

10. An illumination system comprising:
    a. one or more light-emitting devices, each of the one or more light-emitting devices comprising:
       i. at least one semiconductor layer, the at least one semiconductor layer comprising an active region, wherein a primary light is generated in the active region;
       ii. a reflective bottom surface, the reflective bottom surface coupled to the at least one semiconductor layer; and
       iii. a top surface, the top surface coupled to the at least one semiconductor layer, the top surface comprising a solid reflective layer, substantially parallel to the active region and substantially completely overlying the active region, the solid reflective layer reflecting a first portion of the primary light;
          wherein the top surface and the reflective bottom surface redirect the primary light in one or more radial directions, the solid reflective layer substantially preventing any light from being emitted through the solid reflective layer, the one or more radial directions including directions being substantially parallel to the central plane of the active region; and
    b. a light-transmitting zone, the light-transmitting zone optically coupled to the one or more light-emitting devices.

11. The light-emitting device of claim 10, wherein the reflective bottom surface, the at least one semiconductor layer and the top surface form a stack.

12. The illumination system of claim 10, wherein the relative position of the active region, the reflective bottom surface and the top surface is adjusted to substantially transmit the primary light in the one or more radial directions.

13. The illumination system of claim 10, wherein each of the one or more light-emitting devices further comprises an optically transparent overmold to protect the at least one semiconductor layer and the top surface.

14. The illumination system of claim 10, wherein the light-transmitting zone comprises a tapered waveguide.

15. The illumination system of claim 10, wherein the light-transmitting zone comprises at least one reflective surface.

16. An illumination system comprising:
a. one or more light-emitting devices, each of the one or more light-emitting devices comprising:
   i. at least one semiconductor layer, the at least one semiconductor layer comprising an active region, wherein a primary light is generated in the active region;
   ii. a reflective bottom surface, the reflective bottom surface coupled to the at least one semiconductor layer; and
   iii. a top surface, the top surface coupled to the at least one semiconductor layer, the top surface comprising a solid reflective layer, substantially parallel to the active region, the solid reflective layer reflecting a first portion of the primary light;
      wherein the top surface and the reflective bottom surface redirect the primary light in one or more radial directions, the solid reflective layer substantially preventing any light from being emitted through the solid reflective layer, the one or more radial directions including directions being substantially parallel to the central plane of the active region; and
b. a light-transmitting zone, the light-transmitting zone optically coupled to the one or more light-emitting devices;
wherein each of the one or more light-emitting devices further comprises an optical concentrator, the optical concentrator coupled to the top surface, the top surface transmitting a second portion of the primary light, the optical concentrator redirecting the second portion of the primary light substantially parallel to the central plane of the active region, the solid reflective layer being only located at a central area overlying the active region to block light being emitted through a central area of the optical concentrator.

17. An illumination system comprising:
a. one or more light-emitting devices, each of the one or more light-emitting devices comprising:
   i. at least one semiconductor layer, the at least one semiconductor layer comprising an active region, wherein a primary light is generated in the active region;
   ii. a reflective bottom surface, the reflective bottom surface coupled to the at least one semiconductor layer; and
   iii. a top surface, the top surface coupled to the at least one semiconductor layer, the top surface comprising a solid reflective layer, substantially parallel to the active region and substantially completely overlying the active region, the solid reflective layer reflecting a first portion of the primary light;
      wherein the top surface and the reflective bottom surface redirect the primary light in one or more radial directions, the solid reflective layer substantially preventing any light from being emitted through the solid reflective layer, the one or more radial directions including directions being substantially parallel to the central plane of the active region; and
b. a light-transmitting zone, the light-transmitting zone optically coupled to the one or more light-emitting devices;
wherein each of the one or more light-emitting devices farther comprises a wavelength converter, the wavelength converter coupled to the at least one semiconductor layer, the wavelength converter converting the primary light to a secondary light.

* * * * *

UNITED STATES PATENT AND TRADEMARK OFFICE
CERTIFICATE OF CORRECTION

| | |
|---|---|
| PATENT NO. | : 7,375,379 B2 |
| APPLICATION NO. | : 11/313120 |
| DATED | : May 20, 2008 |
| INVENTOR(S) | : Mark Pugh, Gerard Harbers and Scott West |

It is certified that error appears in the above-identified patent and that said Letters Patent is hereby corrected as shown below:

Column 10, line 36, Cancel "farther" and substitute --further--.

Signed and Sealed this

Third Day of November, 2009

David J. Kappos
*Director of the United States Patent and Trademark Office*